(12) United States Patent
Jain et al.

(10) Patent No.: US 11,176,972 B2
(45) Date of Patent: *Nov. 16, 2021

(54) MEMORY POWER MANAGEMENT

(71) Applicant: Taiwan Semiconductor Manufacturing Company, Ltd., Hsinchu (TW)

(72) Inventors: Sanjeev Kumar Jain, Ottawa (CA); Jaspal Singh Shah, Ottawa (CA)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/008,037

(22) Filed: Aug. 31, 2020

(65) Prior Publication Data

US 2020/0395052 A1 Dec. 17, 2020

Related U.S. Application Data

(63) Continuation of application No. 16/216,544, filed on Dec. 11, 2018, now Pat. No. 10,762,931.

(60) Provisional application No. 62/698,707, filed on Jul. 16, 2018.

(51) Int. Cl.
*G11C 5/14* (2006.01)
*G11C 11/417* (2006.01)

(52) U.S. Cl.
CPC .............. *G11C 5/14* (2013.01); *G11C 11/417* (2013.01)

(58) Field of Classification Search
None
See application file for complete search history.

(56) References Cited

U.S. PATENT DOCUMENTS

| 6,426,908 | B1 | 7/2002 | Hidaka | |
| 2010/0128549 | A1* | 5/2010 | Dudeck | G11C 8/12 365/226 |
| 2013/0120045 | A1 | 5/2013 | Hegde | |

* cited by examiner

*Primary Examiner* — James G Norman
(74) *Attorney, Agent, or Firm* — Merchant & Gould P.C.

(57) ABSTRACT

A memory device includes an array of memory cells, such as SRAM cells, and a plurality of peripheral circuits operably coupled to the memory array. A power control circuit is configured to individually control an application of power to each of the plurality of peripheral circuits and the array of memory cells.

20 Claims, 7 Drawing Sheets

MEMORY POWER MANAGEMENT

PRIORITY CLAIM AND CROSS-REFERENCE

This application is a continuation of U.S. application Ser. No. 16/216,544 titled "Memory Power Management" filed Dec. 11, 2018, which claims priority to U.S. Provisional Patent Application No. 62/698,707 titled "SRAM Power Control" filed Jul. 16, 2018, the disclosures of which are hereby incorporated by reference in their entirety.

BACKGROUND

Static random access memory (SRAM) is a type of semiconductor memory that uses bi-stable latching circuitry to store each bit in a memory array. SRAM maintains data in the memory array without the need to be refreshed when powered, but is still volatile such that data is eventually lost when the memory is not powered. Power gating and voltage retention techniques are commonly implemented to the memory array to reduce power consumption. For example, power gates may be used to turn off memory periphery items in a deep sleep mode, and both the periphery items and the memory array in a shut down mode.

When the memory comes out of the shut down mode, power gates are used to ramp up the internal supply voltage of the memory. This can result in a large wake up inrush current.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
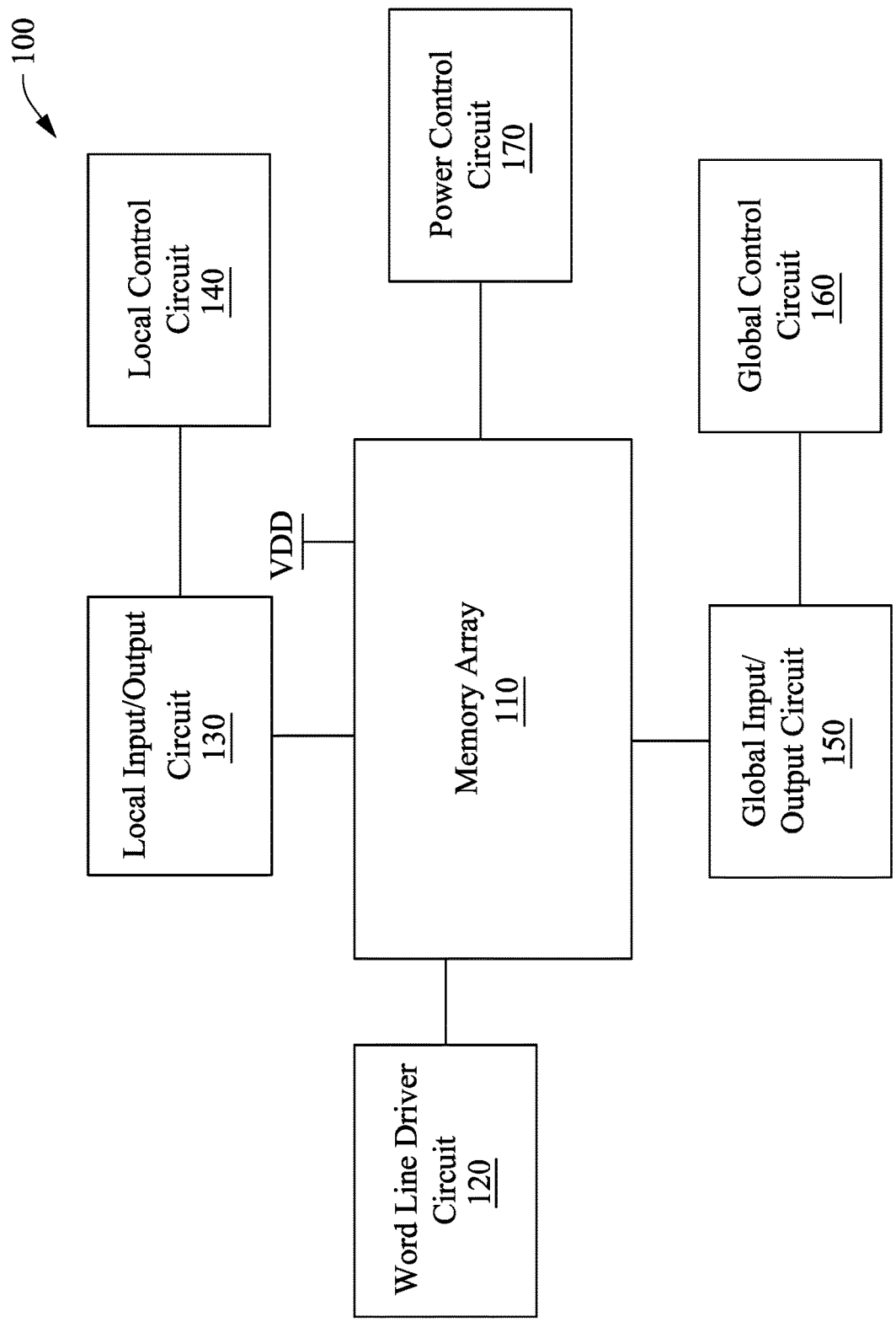
FIG. 1 is a block diagram illustrating an example memory device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some memory architectures, such as static random access memory (SRAM) devices, have two power management modes. In a shut down mode, the memory array of the memory device (where information is stored), as well as circuits peripheral to the memory array, are turned off to conserve power. In situations where it is necessary to maintain data stored by the memory device, a deep sleep power management mode may be used, where power is conserved while maintaining stored information. In a deep sleep mode, power to the memory array is maintained, while devices or circuits peripheral to the memory such as input/output (IO) circuits and other control circuits are turned off.

Power gates are used to turn off the peripheral devices during the deep sleep mode, and are used to turn off both the periphery and memory array during the shut down mode. When the memory comes out of the shut down mode, the power gates are used to ramp up internal supply voltages of the memory device, which can result in a large wake up inrush current.

Embodiments disclosed herein provide methods and systems for minimizing power dissipation in a memory device. For example, the methods and systems disclosed herein limit inrush current in a memory device by providing additional, shallow power management modes in which a controller is configured to switch off desired peripheral devices, rather than the entire periphery of the memory device. Further, during a "wake up" mode where the device is brought out of the shut down or deep sleep mode, the memory array and individual peripheral circuits may be individually powered on to prevent or minimize current inrush. For instance, the memory array and/or peripheral circuits may be individually, sequentially powered on during the wake up operation.

In some examples, the memory device is first partitioned into several blocks. Each block includes circuit elements of a component of the memory device, such as the memory array and various peripheral circuits. Neighboring blocks are electrically isolated from each other in some embodiments. A power controller is configured to control power application to each block individually. Thus, the power controller is operative to selectively power up or power down blocks of the memory device individually. In some examples, each block is provided with a dedicated input port, which is used to provide a signal to control a power gate to power up or power down individual blocks. Further, an indication of the power up or power down may be received at a dedicated output port associated with the various blocks.

Accordingly, one or more blocks that are not accessed during the power up process or are used after a predetermined delay from the waking up of the memory device, may be powered up at a later stages, thereby reducing the amount of inrush current. In addition, electrically isolating and selectively powering on neighboring blocks reduces leakages between the neighboring blocks, thereby reducing an overall power consumption and inrush current.

FIG. 1 discloses a block diagram of an example memory device 100. The memory device 100 can be a random access memory, such as a static random access memory (SRAM) device or another type of memory device such as a dynamic random access memory (DRAM) device. As shown in FIG. 1, the memory device 100 includes at least one memory array 110, as well as a plurality of peripheral circuits such as a word line (WL) driver circuit 120, a local input/output (IO) circuit 130, a local control circuit 140, a global IO circuit 150, a global control circuit 160, and a power control circuit or power controller 170. The memory device 100 may include other components not shown in FIG. 1. In example embodiments, the memory device 100 can be part of an integrated circuit (IC) chip.

The memory array 110 includes a plurality of memory cells (also referred to as bitcells) arranged in a matrix of rows and columns. Each of the memory cells of the memory array 110 is operative to store one bit of information. For example, in some SRAM implementations, each memory cell uses six transistors connected between an upper reference potential and a lower reference potential (typically ground) such that one of two storage nodes can be occupied by the information to be stored, with the complementary information stored at the other storage node.

The memory array 110 includes a plurality of word lines and a plurality of bit line pairs. Each memory cell of the memory array 110 is connected to a word line and a bit line pair. A word line is operative to activate access to the memory cells of a row connected to the word line. The bit line pair is used to access information stored or to be stored in the memory cells activated by the word line. Although the memory device 100 is shown to include only one memory array 110 for ease of discussion, the memory device 100 could include multiple memory arrays 110.

The peripheral devices include circuits that provide various functions of the memory device 100 associated with the memory array 110. For instance, the word line driver circuit 120 of the memory device 100 is operative to select a word line of the cell array 110 and charge the selected word line to a logic high. The logic high is approximately equal to a first predefined potential. In example embodiments, the word line driver circuit 120 is a decoder circuit that includes a plurality of logic operators to decode potentials on address lines to identify a word line to activate. The address lines are charged to logic high (that is, approximately equal to the first potential) or logic low (that is, approximately equal to a second potential). In example embodiments, the second predetermined potential is approximately equal to the ground potential or zero volts. The logic high is represented by bit 1 and the logic low is represented by bit 0.

The local IO circuit 130 of the memory device 100 is operative to read and write data from and into the memory array 110. For example, the local IO circuit 130 is operative to sense potentials at the plurality of bit line pairs and compare the potentials for each pair. In example embodiments, when the potential of a first bit line is more than the potential of a second bit line of a bit line pair, local IO circuit 130 reads the output to be logic 1. In addition, when the potential of a first bit line is less than the potential of the second bit line of the bit line pair, local IO circuit 130 reads the output to be logic 0.

The local control circuit 140 of the memory device 100 is operative to control the local IO circuit 130. For example, the local control circuit 140 is operative to configure the local IO circuit 130 in a read mode to read information from the memory array 110 or in a write mode to write information into the memory array 110. In addition, the local control circuit 140 is operative to enable the local IO circuit 130 in a hold mode where no data is read from or written into memory array 110.

The global IO circuit 150 of the memory device 100 is operative to combine input/output from the local IO circuits 130. For example, the memory device 100 may include multiple memory arrays 110 each having a respective local IO circuit 130. The global IO circuit 150 is operative to combine the information from multiple local IO circuits 130 into a global IO of the memory device 100. For example, local IO circuits 130 are operable to store output from the memory arrays 110 in a shift register, the global IO circuit 150 is operable to read the data from the shift register, and provide the data as the output of memory device 100.

The global control circuit 160 of the memory device 100 is operative to control the global IO circuit 150. For example, the global control circuit 160 is operative to configure the global IO circuit 150 to select one or more local IO circuits 130 to read data from or write data into. In another example, the global control circuit 160 is operative to configure a reading sequence for the global IO circuit 150 to read data from, or a writing sequence to write data into one or more local IO circuits 130.

The power control circuit 170 is operative to control and manage power for one or more components of the memory device 100. For example, the power control circuit 170 is operative to selectively connect one or more components of the memory device 100 to a voltage terminal in some embodiments. The power control circuit 170 includes a plurality of logic gates or power gates. Each of the plurality of power gates is operative to power up or power down an associated component of the memory device 100. The power gates are enabled by a signal. For example, a first signal enables a power gate to power up a component and a second signal enables the power gate to power down the component.

Figure 2A:
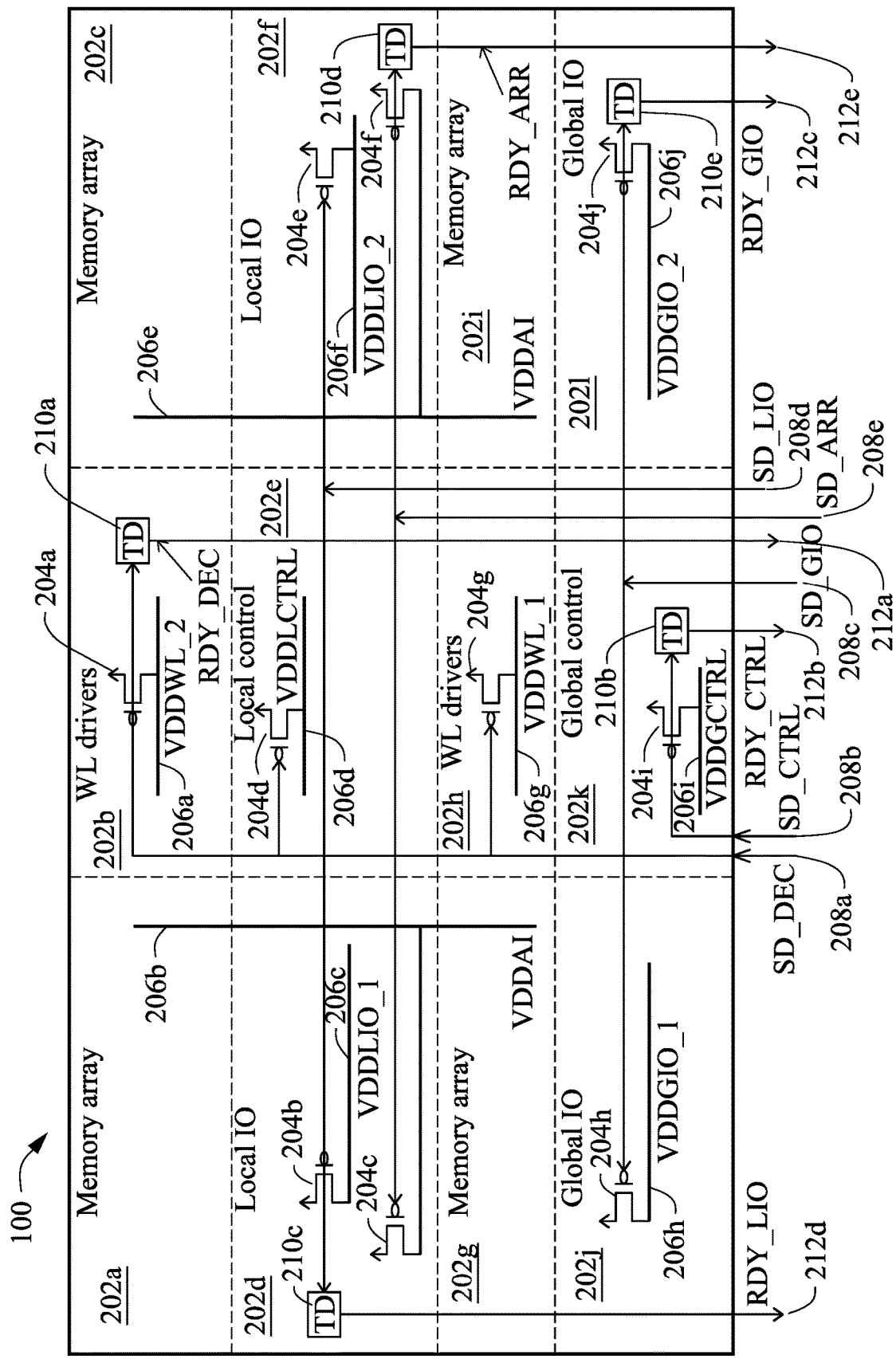
FIG. 2A is a block diagram illustrating components of the example memory device of FIG. 1, in accordance with some embodiments.
Figure 2B:
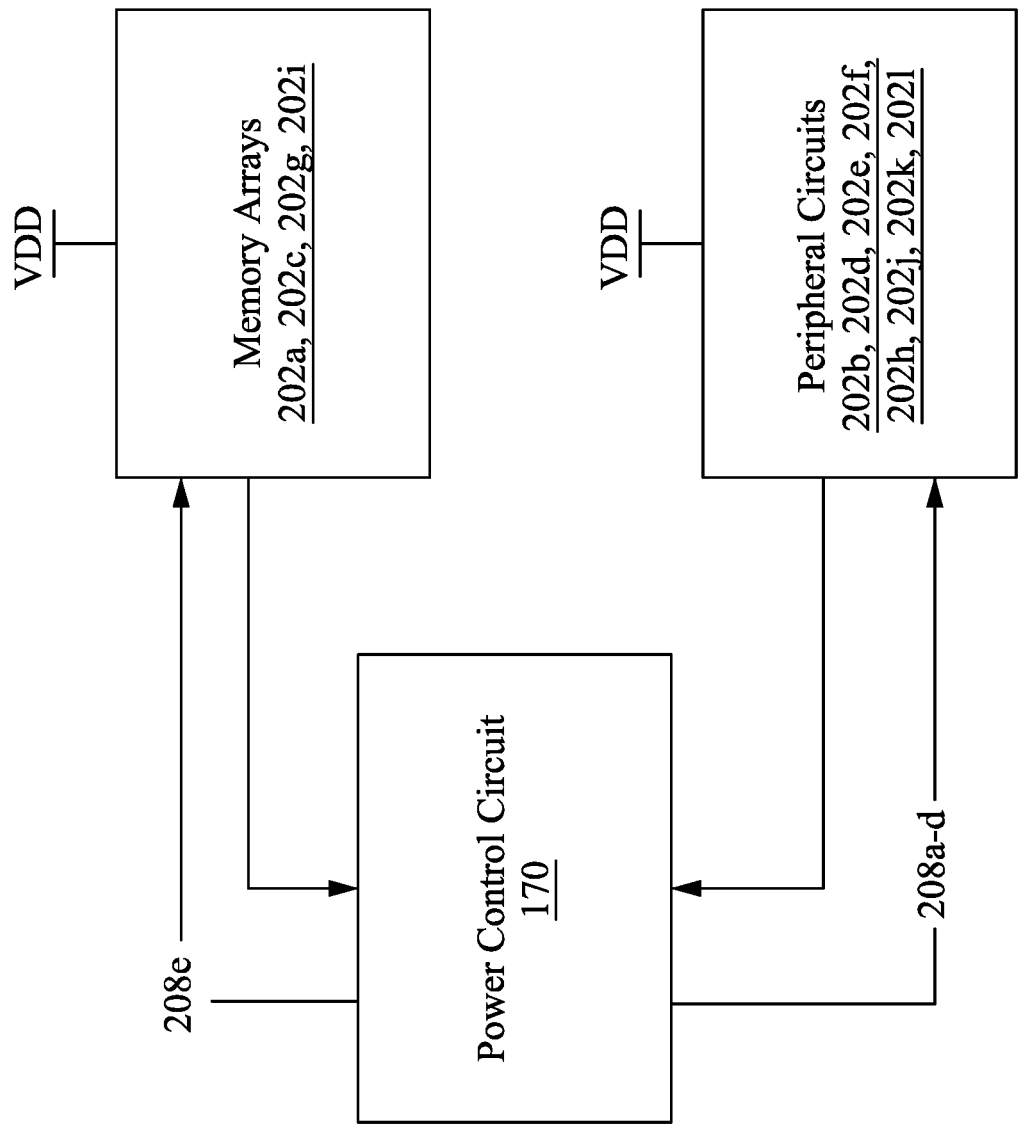
FIG. 2B is a block diagram illustrating components of the example memory device of FIG. 1, in accordance with some embodiments.

FIGS. 2A and 2B illustrate further aspects of the example memory device 100 of FIG. 1. As shown in FIG. 2A, the memory device 100 is partitioned into a plurality of blocks 202a, 202b, 202c, 202d, 202e, 202f, 202g, 202h, 202i, 202j, 202k, and 202l (collectively referred to as blocks 202). Each of the plurality of blocks 202 include elements of the memory cell array 110 or elements of a peripheral circuit operative to perform a predetermined function or a sub-function of the memory device 100. For example, block 202a includes circuit elements of the cell array 110, block 202b includes circuit elements of the WL diver circuit 120, block 202c includes circuit elements of another cell array 110, block 202d includes circuit elements of the local IO circuit 130, block 202e includes components of the local control circuit 140, block 202f includes circuit elements of another local IO circuit 130, block 202g includes circuit elements of yet another memory array 110, block 202h includes circuit elements of another WL driver circuit 120, block 202i includes circuit elements of yet another memory array 110, block 202j includes circuit elements of the global IO circuit 150, block 202k includes circuit elements of the global control circuit 160, and block 202l includes circuit elements of another global IO circuit 150. Although FIG. 2A is shown to include twelve blocks, the memory device 100 could be partitioned into more or fewer number of blocks.

The memory device 100 further includes a plurality of power gates 204a, 204b, 2014c, 204d, 204e, 204f, 204g, 204h, 204i, and 204j (collectively referred to as power gates 204). Each of the power gates 204 can be a switch, such as, a digital switch, an analog switch, a relay, etc. In example embodiments, the power gates 204 can include transistors, such as field effect transistors (FETs). The power gates 204 are also referred to herein as control circuits 204. Although the memory device 100 is shown to include ten power gates 204, the memory device 100 could include less than or more than ten power gates 204.

Each of the power gates 204 is associated with at least one of the blocks 202 of the memory device 100. For example, power gate 204a is associated with block 202b, power gate 204b is associated with block 202d, power gate 204c is associated with blocks 202a and 202g, power gate 204d is associated with block 202e, power gate 204e is associated with block 202f, power gate 204f is associated with blocks 202c and 202i, power gate 204g is associated with block 202h, power gate 204h is associated with block 202j, power gate 204i is associated with block 202k, and power gate 202j is associated with block 202l. Each of the power gates 204 is operable to power up and power down one or more of associated blocks 202. In example embodiments, the power gates 204 power up associated blocks 202 by forming an electrical connection between associated blocks 202 and a voltage terminal. The power gates 204 power down associated blocks 202 by interrupting the electrical connection between associated blocks 202 and the voltage terminal.

For example, the illustrated memory device 100 includes a plurality of voltage terminals 206a, 206b, 206c, 206d, 206e, 206f, 206g, 206h, 206i, and 206j (collectively referred to as voltage terminals 206). Each of the voltage terminals 206 is configured to receive an input voltage and is operative to, when connected to the input voltage, provide power to one or more of the blocks 202. In the illustrated example, the voltage terminal 206a is a word line driver voltage terminal (VDDWL_2) and is associated with the power gate 204a. When connected via the power gate 204a, the voltage terminal 206a is operative to provide power to block 202b. Similarly, the voltage terminal 206b is a memory array voltage terminal (VDDAI) and is associated with the power gate 204c. When connected via the power gate 204e, the voltage terminal 206b is operative to provide power to the memory arrays of blocks 202a and 202g. Moreover, the voltage terminal 206c a local IO voltage terminal (VDDLIO_1) and is associated with the power gate 204b. When connected via the power gate 204b, the voltage terminal 206c is operative to provide power to the local IO circuit of block 202d.

Furthermore, voltage terminal 206d is a local control voltage terminal (VDDLCTRL) and is associated with power gate 204d. When connected via power gate 204d, voltage terminal 206d is operative to provide power to the local controller of block 202e. Moreover, voltage terminal 206e is another memory array voltage terminal (VDDAI) and is associated with power gate 204f. When connected via power gate 204f, the voltage terminal 206e is operative to provide power to the memory arrays blocks 202c and 202i. Furthermore, voltage terminal 206f another local IO voltage terminal (VDDLIO_2) and is associated with power gate 204f. When connected via power gate 204f, voltage terminal 206f is operative to provide power to the local IO circuit of block 202f. Similarly, voltage terminal 206g is a word line driver voltage terminal (VDDWL_1) and is associated with power gate 204g. When connected via power gate 204g, voltage terminal 206g is operative to provide power to the word line drivers of block 202h.

Moreover, the voltage terminal 206h is a global IO voltage terminal (VDDGIO_1) and is associated with power gate 204h. When connected via the power gate 204h, the voltage terminal 206h is operative to provide power to the global IO of block 202j. In addition, the voltage terminal 206i is a global control voltage terminal (VDDGCTRL) and is associated with power gate 204i. When connected via the power gate 204i, voltage terminal 206i is operative to provide power to the global control circuit of block 202k. Moreover, the voltage terminal 206j is another global IO voltage terminal (VDDGIO_2) and is associated with power gate 204j. When connected via the power gate 204j, the voltage terminal 206j is operative to provide power to the global IO of block 202l.

In the example of FIG. 2A, the memory arrays of blocks 202a and 202g, and the memory arrays of blocks 202c and 202i and are connected to respective memory array voltage terminals VDDAI 206b and 206e. The memory array voltage terminals VDDAI 206b and 206e could be configured as a single voltage terminal in other implementations, or four separate voltage terminals in still further embodiments. Additionally, the peripheral circuits shown in blocks 202b, 202d, 202e, 202f, 202h, 202j, 202k and 202l each have respective individual voltage terminals 206a, 206c, 206d, 206f, 206g, 206h, 206i and 206j. In some embodiments, different input voltage levels could be applied to various input terminals. In still further examples, each of the peripheral circuits could be connected to a single voltage terminal via the respective power gates 204, or subsets of selected blocks could be connected to shared voltage terminals.

Each of the power gates 204 is enabled to power up the associated blocks 202 in response to activation signals output by the power controller 170, and are enabled to power down associated blocks in response to de-activation signals received from the power controller 170. In example embodiments, activation and de-activation signals are also referred to as first and second signals respectively. The activation and de-activation signals are provided via input ports.

FIG. 2B illustrates an example of the power controller 170. Referring to FIGS. 2A and 2B, the example memory device 100 includes input ports 208a, 208b, 208c, 208d, and 208e (collectively referred to as input ports 208). Each of the input ports 208 is associated with or is dedicated to one or more of the power gates 204 and is operative to provide the activation and the de-activation signals received from corresponding output ports of the power controller 170 to the associated power gates 204. Dedicated input ports 208 enable granular control of the power gates 204, and hence individual powering up and powering down of the memory arrays and peripheral circuits of the blocks 202. In example embodiments, each of the input ports 208 is provided as an input pin in the memory device 100.

The input port 208a is operative to provide activation and de-activation signals from the power controller 170 to power gates 204a, 204d, and 204g corresponding to the word line drivers of blocks 202b and 202h, as well as the local control of block 202e. Moreover, input port 208b is operative to provide activation and de-activation signals from the power controller 170 to the power gate 204i for the global control of block 202k, and the input port 208c is operative to provide activation and de-activation signals to power gates 204h and 204j of the global IO blocks 202j and 202l. Furthermore, the input port 208d is operative to provide activation and de-activation signals to power gates 204b and 204e of the local IO blocks 202*d* and 202*f*, and the input port 208*e* is operative to provide activation and de-activation signals to power gates 204*c* and 204*f* for the memory arrays in blocks 202*a*, 202*g*, 202*c* and 202*f*.

In example embodiments, the power controller 170 is configured to operate the memory device 100 in various power management modes. For instance, upon receipt of the activation signals from the power controller 170, the power gates 204 are operative to form an electrical connection between the associated blocks 202 and the corresponding voltage terminals 206. Formation of the electrical connection initiates powering up of the associated blocks 202. During this process the blocks 202 are in a power up or wake up mode. After the completion of the powering up, the blocks 202 are in a ready mode. In the ready mode, the blocks 202 are operative to perform one or more functions associated with the memory device 100. Moreover, upon receipt of the de-activation signals, the power gates 204 are operative to interrupt the electrical connection between associated blocks 202 and the corresponding voltage terminals 206. The interruption of the electrical connection initiates powering down of associated blocks 202. After the completion of the powering down, blocks 202 are in a shutdown power or sleep mode. For example, in a shutdown power management mode, the memory arrays and the peripheral circuits (i.e. all of the blocks 202) are all powered down. In a sleep mode, power is maintained to the memory arrays, while one or more of the peripheral circuits is powered down.

Sensor circuits are used to sense the different operating modes of the blocks 202 of the memory device 100. For example, the memory device 100 includes a plurality of sensors 210*a*, 210*b*, 210*c*, 210*d*, and 210*e* (collectively referred to as sensors 210). Each of the sensors 210 is operative to sense whether associated blocks 202 are in a wake up mode, a ready mode, or a shutdown mode. In example embodiments, the sensors 210 are operative to detect the electrical connection and interruption of the electrical connection of associated blocks 202 from corresponding voltage terminals 206 to sense the different operating modes. In other example embodiments, the sensors 210 are operative to detect states (ON or OFF) of the power gates 204 associated with each of blocks 204 to sense the different operating modes.

In addition, each of the sensors 210 is operative to provide output signals received by the controller 170 indicative of the sensed operating modes. The output signals are provided at output ports of the memory device 100. For example, memory device 100 includes output ports 212*a*, 212*b*, 212*c*, 212*d*, and 212*e* (collectively referred to as output ports 212). In example embodiments, the output ports 212 are provided as output pins in the memory device 100.

For example, the sensor 210*a* is operative to sense operating modes of the word line drivers and local control of blocks 202*b*, 202*e*, and 202*h*, and provide corresponding output signals at output port 212*a*. Similarly, sensor 210*b* is operative to sense operating modes of the global control of block 202*k* and provide corresponding output signals at output port 212*b*. Furthermore, sensor 210*e* is operative to sense operating modes of the global IO of blocks 202*j* and 202*l*, and provide a corresponding output signal at output port 212*c*. Moreover, sensor 210*c* is operative to sense operating modes of the local IO circuits of blocks 202*d* and 202*f*, and provide corresponding output signals at output port 212*d*. Sensor 210*d* is operative to sense operating modes of the memory arrays of blocks 202*a*, 202*c*, 202*g*, and 202*i*, and provide corresponding output signals at output port 212*e*. The output ports 212 are coupled to corresponding input terminals of the power controller 170.

In example embodiments, each of the blocks 202 of the memory device 100 is electrically isolated from its neighboring blocks. In other example embodiments, two neighboring blocks are electrically isolated when they are configured to operate at different potentials. In yet other example embodiments, two neighboring blocks are electrically isolated when they are powered up sequentially with respect to each other. The electrical isolation is created by either providing a dielectric material or an isolation circuit. An example isolation circuit is discussed with reference to FIG. 3 of the disclosure.

Figure 3:
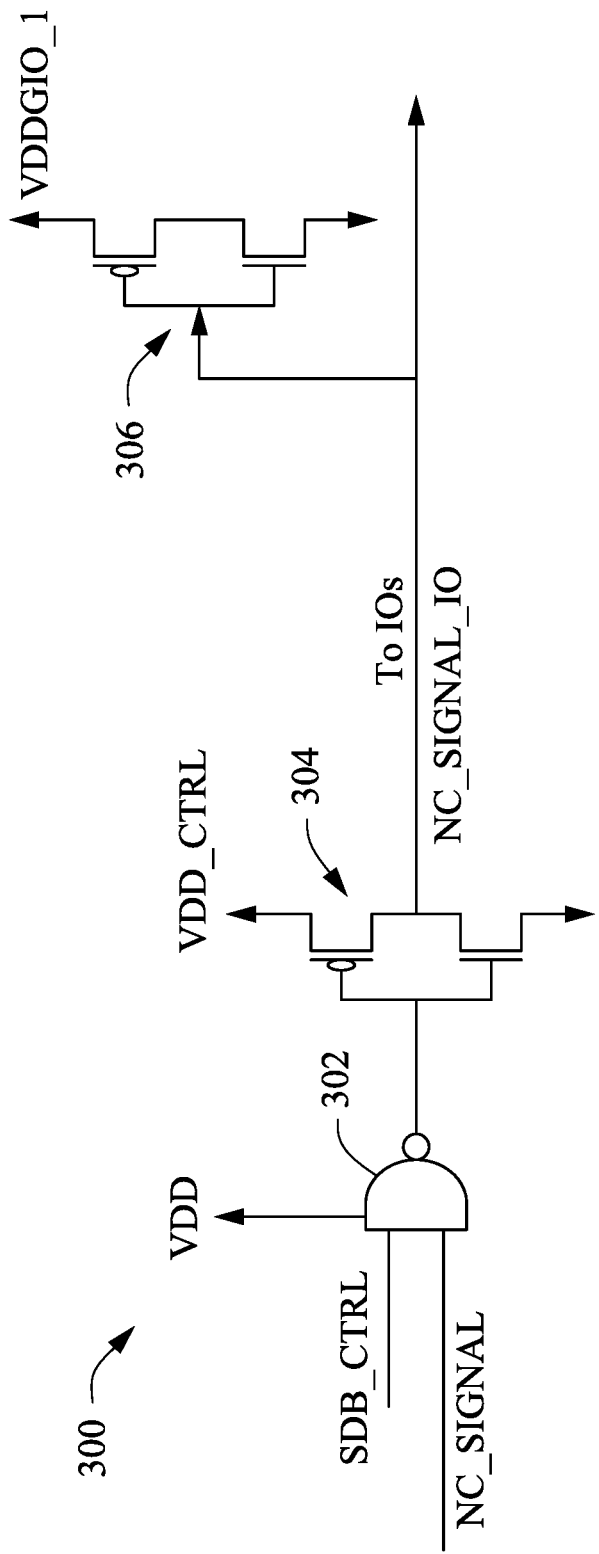
FIG. 3 is a circuit diagram illustrating an example of an isolation circuit, in accordance with some embodiments.

FIG. 3 illustrates an example isolation circuit 300. The illustrated isolation circuit 300 is provided between neighboring blocks 202 to minimize current leakage between neighboring blocks 202. In example aspects, the isolation circuit 300 is operative to interrupt a current path between a first block when the first block is powered up and a neighboring second block that is still not powered up, or vice versa. In other example aspects, the isolation circuit 300 is operative to interrupt a current path between a first block when the first block is configured to operate at a different potential than a neighboring second block. The isolation circuit 300 interrupts the current path by providing an alternative path for the leakage current to ground.

The example isolation circuit 300 of FIG. 3 is operative to isolate the global control circuit of block 202*k* from the global IO circuit of block 202*l*. As shown in FIG. 3, the isolation circuit 300 includes a first logic operator 302, a second logic operator 304, and a third logic operator 306. In example embodiments, the first logic operator 302 includes a NAND logic gate. However, the first logic operator 302 could include other types of logic gates in alternative implementations.

The NAND gate 302 has a shut down control signal bar SDB_CTRL input and a non-clocked control signal. When the memory device 100 transitions to a wake up mode, and power is to be applied to the global IO control circuit of block 202*k*, the shut down control signal goes to a logic low, so the shut down control signal bar SDB_CTRL input to the NAND gate 302 goes to a logic high. The non-clocked signal NC_SIGNAL is at a logic low, so the input to the inverter 304 is a logic high. The output of the inverter 304 is a non-clocked control signal (NC_SIGNAL_IO) that is output to the global IO circuit. The non-clocked control signal NC_SIGNAL_IO is driven to logic 0 by the inverter 304 in order to save leakage from the global driver circuit and avoid cross-domain leakage.

Figure 4:
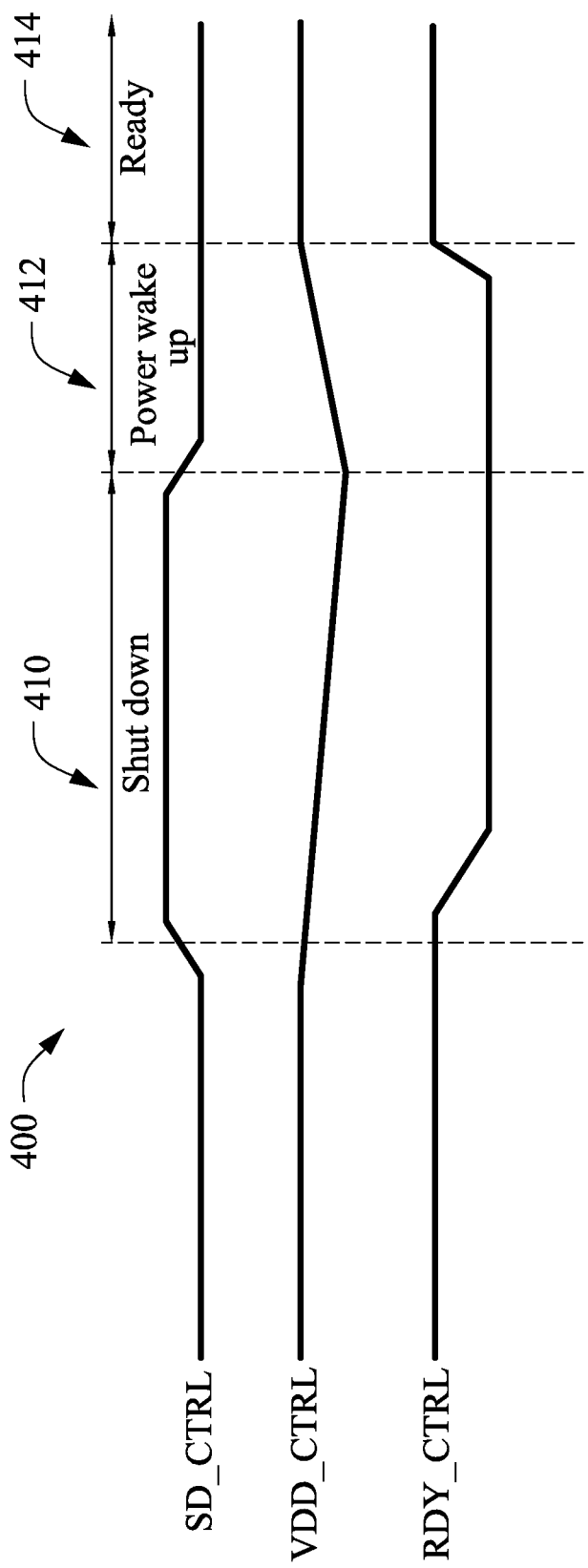
FIG. 4 is a timing diagram illustrating examples of wave forms, in accordance with some embodiments.

FIG. 4 illustrates an example of potential profiles 400 of a block of the memory device 100. More specifically, FIG. 4 illustrates wave forms of an example control block (for example, block 202*k*) of the memory device 100. As shown in FIG. 4, during a shutdown operating mode 410, a first (SD_CTRL) signal to a power gate associated with the control block is logic high. In response to the SD_CTRL signal being logic high, the power gate interrupts an electrical connection between the control block and an associated voltage terminal. Hence, as shown in FIG. 4, a potential (VDD_CTRL) at the control block decreases to approximately equal to logic low. Since, the control block is electrically disconnected from the associated voltage terminal, and as shown in FIG. 4, an output (RDY_CTRL) signal of a sensor circuit associated with the control block is logic low indicating that the control block is in the shut down mode.

As shown in FIG. 4, to wake up the control block, the SD_CTRL signal is changed to logic low during a power wake up operating mode 412. In response to the SD_CTRL signal being logic low, the power gate forms an electrical connection between the control block and the associated voltage terminal. Hence, the potential VDD-CTRL at the control block rises approximately equal to logic high. Since, the control block is electrically connected to the associated voltage terminal, and as shown in FIG. 4, the RDY_CTRL signal of the sensor circuit associated with the control block rises to logic high indicating that the control block is in the wake up mode. After the wake up mode 412, the control block enters into a ready mode 414. As shown in FIG. 4, in the ready mode 414, the SD_CTRL signal is at logic low, the VDD_CTRL signal is at logic high, and the RDY_CTRL signal is at logic high to signal the ready mode.

Figure 5:
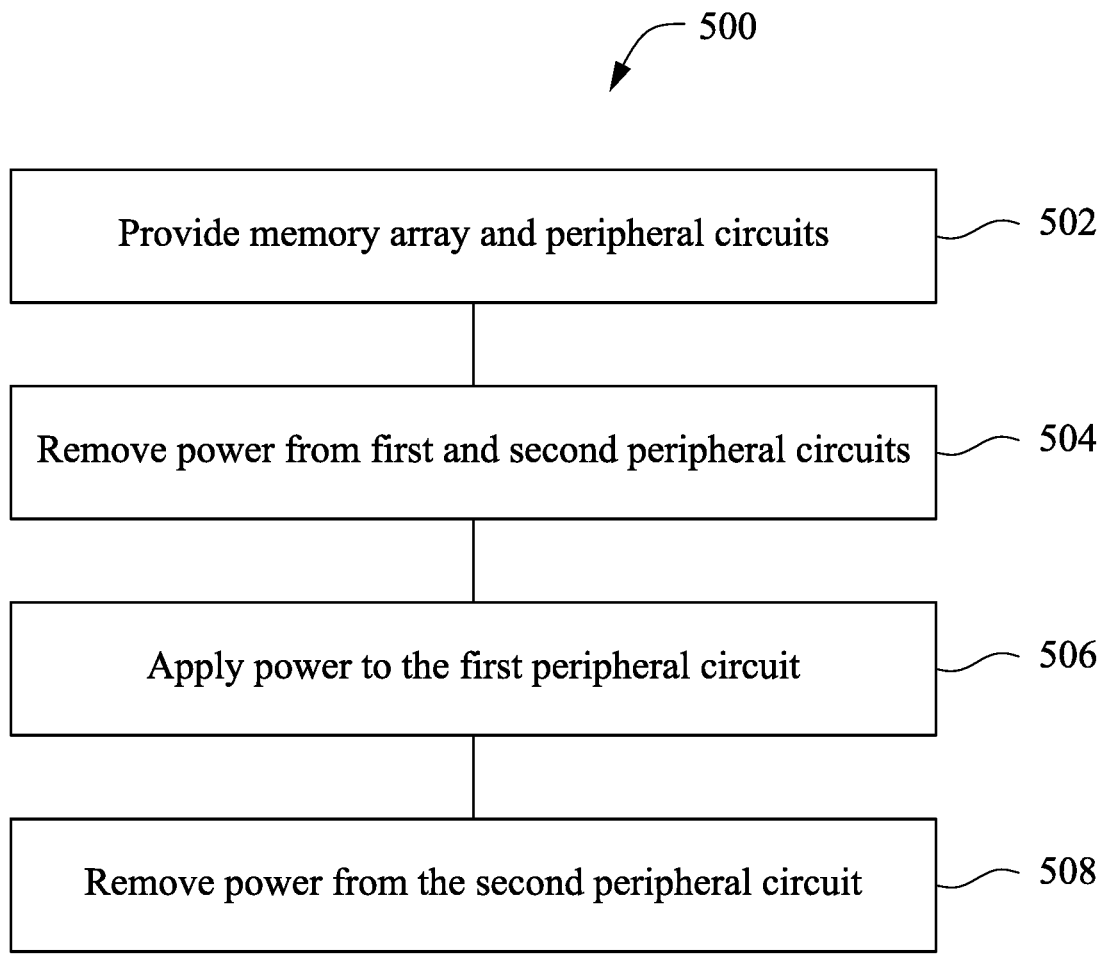
FIG. 5 is a flow diagram illustrating an example of a method for controlling of a memory device, in accordance with some embodiments.

FIG. 5 illustrates a method 500 for controlling power of a memory device, in accordance with aspects of the disclosure. For example, steps of method 500 may be executed by the memory controller 170 to control power of memory device 100 of FIGS. 1 and 2. In an example embodiment, the steps of method 500 may be performed by a processor and a memory of the memory controller 170. The steps of method 500 are stored as instructions on the memory which when executed by the processor configures the processor to perform method 500.

At a first operation shown in block 502, a memory device such as the memory device 100 is provided, that includes a memory array 110 having a plurality of memory cells. Additionally, a plurality of peripheral circuits are provided, such as word line drivers, local and global IO circuits, local and global control circuits, etc. Examples of the peripheral circuits are shown in the blocks 202 of FIG. 2A. In the method of FIG. 5, the peripheral circuits generally include a first peripheral circuit and a second peripheral circuit as shown in block 504. In block 506, the memory device is operated in a first power management mode including removing power from the first and second peripheral circuits. In some examples, this is referred to as a sleep mode. In some embodiments, power is further removed from the memory arrays in a shut down mode. Rather than apply power to all of the shut down peripheral circuits, in block 506, power is restored or provided to the first peripheral circuit, while power is still removed from the second peripheral circuit as shown in block 508. By controlling power individually to the memory array and various peripheral circuits, current inrush may be avoided. Thus, after power is restored to the first peripheral circuit, power is then restored to the second peripheral circuit. In some examples, power is applied to and removed from the memory array and various peripheral circuits in a predetermined sequence in various power management modes.

Figure 6:
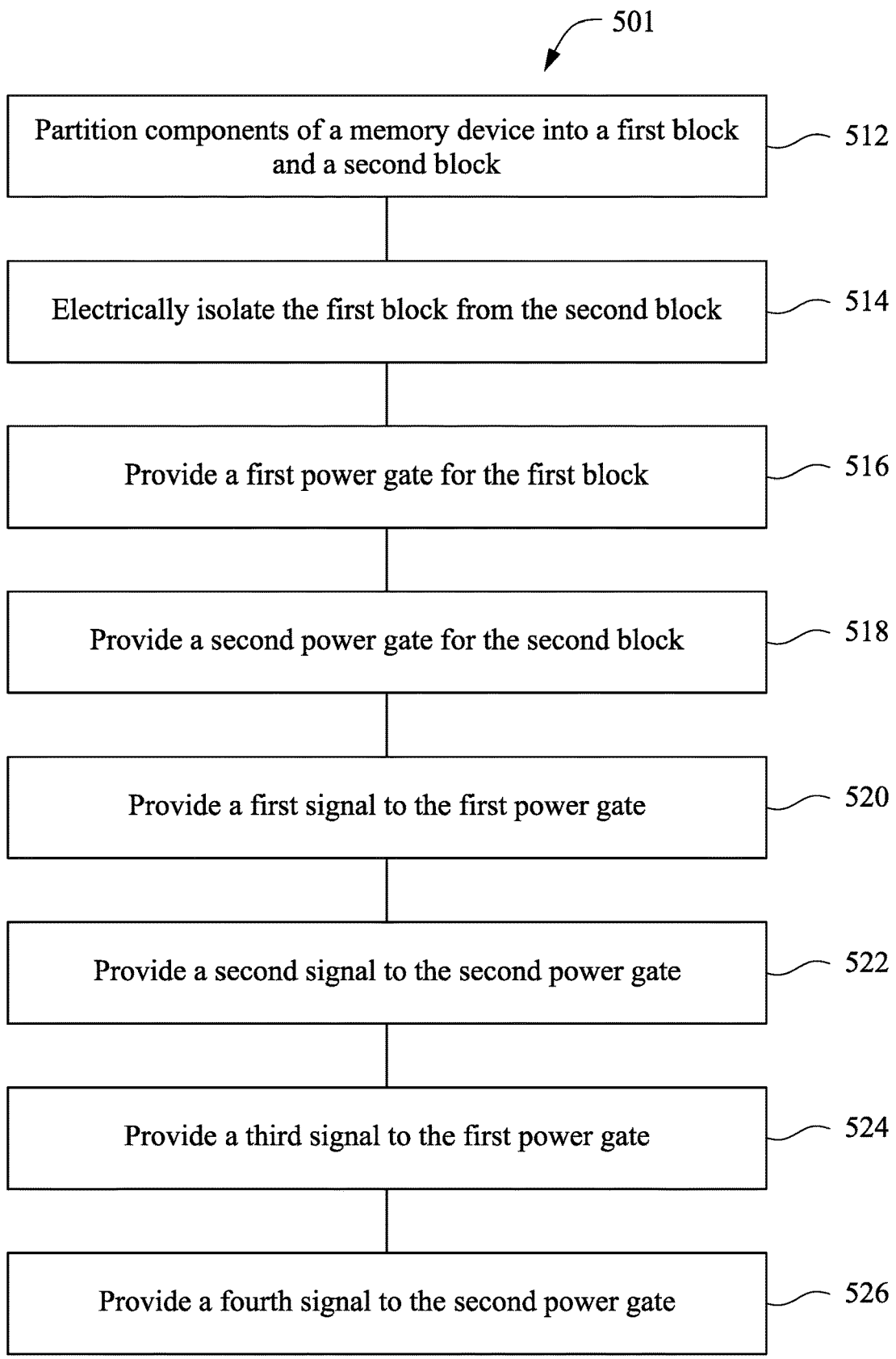
FIG. 6 is a flow diagram illustrating another example of a method for controlling of a memory device, in accordance with some embodiments.

FIG. 6 illustrates another power control method 501 in accordance with disclosed embodiments. At block 512, components of a memory device are portioned into a plurality of blocks, including a first block and a second block. Components are partitioned, for example, by classifying circuit elements of a functional unit as one block. For example, circuit elements of the memory array 110 may be classified as the first block and circuit elements of word line driver circuit 120 may be classified as the second block. In some embodiments, components of a memory device are partitioned based on a power up and powering down sequence of the components. For example, peripheral circuits (such as the word line driver circuit 120, the local IO circuit 130, the local control circuit 140, the global IO circuit 150, and the global control circuit 160), which are first to be powered up are classified into a first block, and circuit elements of the memory array 110 which are powered up after the powering up of the peripheral devices are classified into a second block. In other example embodiments, components of a memory device are portioned based on an operating potential of the components. For example, circuit elements of a local IO circuit 130 which operate at a first potential are classified into a first block and circuit elements of a global IO circuit 150 which operate on a second potential are classified into a second block. The memory device can be portioned into more than two blocks. For example, and as discussed with reference to FIG. 2A, memory device 100 can be portioned into twelve blocks 202.

At block 514, the first block is electrically isolated from the second block. The first block is electrically isolated from the second block by providing an isolation layer between the first block and the second block. For example, the first block can be electrically isolated from the second block by providing a dielectric material layer between the first block and the second block. In another example, the first block can be electrically isolated from the second circuit by providing an isolation circuit, such as the example isolation circuit 300, between the first block and the second block. In addition to electrically isolating the first block from the second block, the first block is be electrically isolated from all other neighboring blocks in some examples.

At block 516, a first power gate is provided for the first block. The first power gate is operative to selectively power up and power down the first block based on received power control signals. For example, the first power gate is operative to power up the first block after receiving a first signal by electrically connecting the first block to a voltage terminal associated with the first block. Similarly, the first power gate is operative to power down the first block after receiving a second signal by interrupting the electrical connection between the first block and the voltage terminal associated with the first block.

At block 518, a second power gate is provided for the second block. The second power gate is operative to selectively power up and power down the second block. For example, the second power gate is operative to power up the second block after receiving a third signal by forming an electrical connection between the second block and a voltage terminal associated with the second block. Similarly, the second power gate is operative to power down the second block after receiving a fourth signal by interrupting the electrical connection between the second block and the voltage terminal associated with the second block.

At block 520, a first signal is provided to the first power gate. The first signal is provided from the power controller via a dedicated port to enable the first power gate to power up the first block. The first power gate, upon receiving the first signal, is operative to power up the first block by forming an electrical connection between the first block and a voltage terminal associated with the first block. For example, a first signal is provided to the power gate 204a via the input port 208a, which then forms an electrical connection between the voltage terminal 206a and block 202b.

At block 522, a second signal is provided to the second power gate. The second signal is provided from the power controller 170 via a dedicated port to enable the second power gate to power up the second block. The second power gate, upon receiving the second signal, is operative to power up the second block by forming an electrical connection between the second block and a voltage terminal associated with the second block. For example, a second signal is provided to power gate 204i over input port 208a, which then forms an electrical connection between voltage terminal 206*i* and block 202*k*. In example embodiments, the powering up of the first block and the second block is performed sequentially. That is, the second signal to enable the second control circuit to power up the second block is provided after a predetermined time from providing the first signal to enable the first control circuit to power up the first block.

At block 524, a third signal is provided to the first power gate. The third signal is provided via the dedicated port to enable the first power to power down the first block. The first power gate, upon receiving the third signal, is operative to power down the first block by interrupting the electrical connection between the first block and the voltage terminal associated with the first block. For example, a third signal is provided to the power gate 204*a* over the input port 208*a*, which interrupts the electrical connection to block 202*b* from the voltage terminal 206*a*.

At block 526, a fourth signal is provided to the second power gate. The fourth signal is provided via the dedicated port to enable the second power gate to power down the second block. The second power gate, upon receiving the fourth signal, is operative to power down the second block by interrupting the electrical connection between the second block and the voltage terminal associated with the second block. For example, a fourth signal is provided to the power gate 204*i* over the input port 208*b*, which then interrupts the electrical connection between the voltage terminal 206*i* and block 202*k*.

In example embodiments, the powering up of the various blocks 202 of memory device 100 is performed sequentially. That is, in example embodiments, peripheral circuit blocks (such as word line driver circuit 120, local IO circuit 130, local control circuit 140, global IO circuit 150, and global control circuit 160) are powered up before the memory array 110. During a predetermined time gap between the power up, an additional power management mode puts memory device 100 in a shallow sleep mode and then resumes its normal read/write operation. Hence, disclosed embodiments provide a smaller inrush current due power control of individual elements of the memory device initiated by the memory controller. In addition, more granularity in the leakage savings is provided due to the introduction of the shallow sleep mode, which allows the memory controller to switch off any component of memory device 100 based on the sleep time.

The present disclosure thus includes embodiments of a memory device that includes an array of memory cells, such as SRAM cells, and a plurality of peripheral circuits operably coupled to the memory array. A power control circuit is configured to individually control an application of power to each of the plurality of peripheral circuits and the array of memory cells. In other words, the power controller is thus configured to control the peripheral circuits individually, rather than as a group.

In accordance with further embodiments, a memory power control system includes a power controller that has a first output terminal configured to provide a first power control signal to a memory array of a memory device, a second output terminal configured to provide a second power control signal to a first peripheral circuit of the memory device, and a third output terminal configured to provide a third power control signal to a second peripheral circuit of the memory device.

In accordance with still further embodiments, a memory device power control method includes providing a memory device with a memory array having a plurality of memory cells, a first peripheral circuit and a second peripheral circuit. The memory device is operated in a first power management mode that includes removing power from the first and second peripheral circuits. The memory device is further operated in a second power management mode that includes applying power to the first peripheral circuit and removing power from the second peripheral circuit.

This disclosure outlines various embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory power control system, comprising:
a power controller including:
a first output terminal configured to provide a first power control signal to selectively electrically connect a first memory array of a memory device to a corresponding voltage terminal;
a second output terminal configured to provide a second power control signal to selectively connect a second memory array of the memory device to a corresponding voltage terminal;
a third output terminal configured to provide a third power control signal to selectively connect a first peripheral circuit of the memory device to a corresponding voltage terminal;
a fourth output terminal configured to provide a fourth power control signal to selectively connect a second peripheral circuit of the memory device to a corresponding voltage terminal; and
wherein the power controller is configured to output the second and third power control signals to apply power to the first peripheral circuit while power is removed from the second peripheral circuit.

2. The memory device of claim 1, further comprising an isolation circuit configured to electrically isolate the first peripheral circuit from the second peripheral circuit.

3. The memory device of claim 2, wherein the power controller is configured to output the second and third power control signals to apply power to the first peripheral circuit while power is removed from the second peripheral circuit, and wherein the isolation circuit is configured to electrically isolate the first peripheral circuit from the second peripheral circuit in response thereto.

4. The memory device of claim 1, wherein the first peripheral circuit is a word line driver circuit and the second peripheral circuit is an input/output circuit.

5. The memory device of claim 1, wherein the memory cells include SRAM memory cells.

6. The memory device of claim 1, wherein the power controller further comprises:
a first input terminal configured to receive a first power status signal from the memory array of the memory device;
a second input terminal configured to receive a second power status signal from the first peripheral circuit of the memory device; and a third input terminal configured to receive a third power status signal from the second peripheral circuit of the memory device.

7. The memory device of claim 1, further comprising input terminals to receive status signals from the respective voltage terminals of the first peripheral circuit and the second peripheral circuit.

8. The memory device of claim 1, further comprising:
a first power gate coupled to the first output terminal configured to connect the memory array to a voltage terminal in response to the first power control signal;
a second power gate coupled to the second output terminal configured to connect the first peripheral circuit to the voltage terminal in response to the second power control signal;
a third power gate coupled to the third output terminal configured to connect the second peripheral circuit to the voltage terminal in response to the third power control signal.

9. A memory device comprising:
a plurality of arrays of memory cells;
a plurality of peripheral circuits operably coupled to the plurality of arrays of memory cells;
a plurality of voltage terminals corresponding to the plurality of arrays of memory cells and the plurality of peripheral circuits;
a power control circuit configured to individually control an electrical connection of each of the plurality of peripheral circuits and the plurality of arrays of memory cells to their corresponding voltage terminals;
a plurality of sensors configured to detect the electrical connection of each of the plurality of peripheral circuits and the plurality of arrays array of memory cells to their corresponding voltage terminals; and
a plurality of output ports, wherein each of the plurality of peripheral circuits and the memory array has a respective output port, and wherein each output port is configured to provide a respective power status signal to the control circuit.

10. The memory device of claim 9, further comprising an isolation circuit configured to electrically isolate adjacent peripheral circuits from another.

11. The memory device of claim 9, wherein the power control circuit is configured to selectively operate the memory device in a first power management mode wherein power is removed from each of the plurality of peripheral circuits, and a wake up mode including sequentially applying power to the plurality of peripheral circuits.

12. The memory device of claim 11, wherein the power control circuit is configured to sequentially remove power from the plurality of peripheral circuits in the first power management mode.

13. The memory device of claim 9, wherein the memory cells include SRAM memory cells.

14. The memory device of claim 9, wherein the peripheral circuits comprise at least one of a word line driver and an input/output circuit.

15. The memory device of claim 14 wherein the plurality of peripheral circuits further comprises of at least one of the following: a local input/output circuit, a global input/output circuit, a local input/output controller, and a global input output controller.

16. A method of operating a memory device, comprising:
providing a plurality of memory arrays;
providing a plurality of peripheral circuits;
operating the memory device in a first power management mode including removing power from at least one of the plurality of memory arrays and/or at least one of the plurality of peripheral circuits;
operating the memory device in a second power management mode including applying power to at least one selected memory array and/or the peripheral circuit;
wherein transitioning from the first power management mode to the second power management mode includes:
receiving a first control signal;
connecting a first one of the memory arrays and/or peripheral circuits to a first power terminal in response to the first control signal;
connecting a second one of the memory arrays and/or peripheral circuits to a second power terminal in response to the first control signal and a status signal indicating the first one of the memory arrays and/or peripheral circuits is connected to the first power terminal.

17. The method of claim 16, wherein the first power terminal has a first voltage level and the second power terminal has a second voltage level different than the first voltage level.

18. The method of claim 16, wherein the plurality of memory arrays are SRAM memory arrays, and wherein the plurality of peripheral circuits include at least one of a word line driver circuit and an input/output circuit.

19. The method of claim 16, further comprising interrupting a current path between the first one of the memory arrays and/or peripheral circuits and the second one of the memory arrays and/or peripheral circuits.

20. The method of claim of claim 19, wherein interrupting the current path includes receiving a non-clocked control signal and interrupting the current path in response to the non-clocked control signal.

\* \* \* \* \*